(12) United States Patent
Yoshimoto

(10) Patent No.: US 6,349,071 B1
(45) Date of Patent: Feb. 19, 2002

(54) SYNCHRONOUS SEMICONDUCTOR STORAGE DEVICE

(75) Inventor: Takahiko Yoshimoto, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/699,270

(22) Filed: Oct. 26, 2000

(30) Foreign Application Priority Data

Feb. 16, 2000 (JP) ........................................ 2000-038880

(51) Int. Cl.[7] ................................................. G11C 8/00
(52) U.S. Cl. ............... 365/233; 365/230.01; 365/233.5; 365/230.08; 365/191; 365/194
(58) Field of Search ................. 365/230.01, 189.01, 365/233, 233.5, 230.08, 191, 194

(56) References Cited

U.S. PATENT DOCUMENTS

| | | | |
|---|---|---|---|
| 5,696,729 A | | 12/1997 | Kitamura |
| 5,880,998 A | * | 3/1999 | Tanimura et al. ...... 365/189.05 |
| 5,926,434 A | | 7/1999 | Mori |
| 6,026,029 A | * | 2/2000 | Dosaka et al. ......... 365/189.01 |
| 6,055,207 A | * | 4/2000 | Nam ..................... 365/233 |
| 6,069,508 A | * | 5/2000 | Takai ..................... 327/161 |
| 6,101,151 A | * | 8/2000 | Watanabe et al. ......... 365/233 |
| 6,134,178 A | * | 10/2000 | Yamazaki et al. ......... 365/233 |
| 6,166,990 A | * | 12/2000 | Ooishi et al. ........... 365/233 |
| 6,188,641 B1 | * | 2/2001 | Uchida ................... 365/233 |
| 6,215,726 B1 | * | 4/2001 | Kubo ..................... 365/233 |
| 6,256,260 B1 | * | 7/2001 | Shim et al. .............. 365/233 |

FOREIGN PATENT DOCUMENTS

| | | | |
|---|---|---|---|
| JP | 7-177015 | | 7/1995 |
| JP | 11-16349 | | 1/1999 |
| JP | 02000030438 A | * | 1/2000 |

* cited by examiner

Primary Examiner—Viet Q. Nguyen
(74) Attorney, Agent, or Firm—Morrison & Foerster LLP

(57) ABSTRACT

A synchronous semiconductor storage device includes: an internal clock activation signal generation circuit for generating an internal clock activation signal cke_c and a latch signal cke1 based on a system clock signal CLK and a clock activation signal CKE each having a series of pulses; a CKE latch clock control signal generation circuit for generating, based on the internal clock activation signal cke_c, the latch signal cke1, the system clock signal CLK, and the clock activation signal CKE, a CKE latch clock control signal cke_x which controls activation/inactivation of a CKE latch clock signal, and an internal clock signal generation circuit for generating an internal clock signal clk_in based on the internal clock activation signal cke_c and the system clock signal CLK, wherein stored data corresponding to a plurality of external signals including a control signal and an address signal are transmitted in synchronization with the internal clock signal clk_in.

7 Claims, 10 Drawing Sheets

SYNCHRONOUS SEMICONDUCTOR STORAGE DEVICE

BACKGROUND OF THE INVENTION

1. Field of the Invention

The present invention relates to a synchronous semiconductor storage device, and specifically to a synchronous semiconductor storage device in which the amount of current consumed in a standby mode is reduced.

2. Description of the Related Art

In recent years, along with the increase in operation speed of microprocessors, etc., demand for semiconductor storage devices which operate at higher speed has been growing. A semiconductor storage device developed for the purpose of meeting such a demand is a synchronous semiconductor storage device that operates in a synchronous burst operation mode. In such a storage device, high speed readout of data is achieved in addition to the increase in speed for normal random access, although an access method is limited to some extent.

The synchronous burst operation mode used in a clock synchronous semiconductor storage device is a high speed access mode in which predetermined data rows are sequentially output in synchronization with a system clock signal. One example of a synchronous semiconductor storage device which operates in a synchronous burst operation mode include a synchronous DRAM (hereinafter, referred to as "SDRAM").

FIG. 8 shows an exemplary structure of an input circuit used in an SDRAM. This input circuit includes an internal clock activation signal generation circuit 52 which receives a system clock signal CLK and a clock activation signal CKE and outputs an internal clock activation signal φ51, and an internal clock signal generation circuit 53 which generates an internal clock signal clk_in based on the internal clock activation signal φ51 and the system clock signal CLK.

FIG. 9 shows a structure of the internal clock activation signal generation circuit 52 which includes a pair of D-flip flop (D-FF) circuits 50 and 51 and an inverter INV50. The first D-FF circuit 50 receives a clock activation signal CKE at a data input terminal D, and a system clock signal CLK at a clock input terminal CK.

The first D-FF circuit 50 outputs a CKE latch output signal φ50 from its output terminal Q to a data input terminal D of the second D-FF circuit 51. The second D-FF circuit 51 receives a system clock signal CLK at its clock terminal CK through the inverter INV50. The second D-FF circuit 51 outputs from its output terminal Q an internal clock activation signal φ51 to the internal clock signal generation circuit 53.

FIG. 10 shows a structure of the internal clock signal generation circuit 53. The internal clock signal generation circuit 53 includes an NAND gate NAND54 and an inverter INV55. The NAND gate NAND54 receives the internal clock activation signal φ51 from the internal clock activation signal generation circuit 52, and the system clock signal CLK. The inverter INV55 receives an output of the NAND gate NAND54. The internal clock signal generation circuit 53 outputs an output of the inverter INV55 as an internal clock signal clk_in.

Operations of the input circuit having the above structure are described with reference to a timing chart as shown in FIG. 11. Upon receiving the system clock signal CLK, the input circuit receives, at each rising edge of the pulse of the system clock signal CLK, a control signal and an address signal from outside in a time-division manner.

As shown in FIG. 11, the internal clock signal clk_in, which is used for receiving the control signal and the address signal, is controlled by the level of the clock activation signal CKE at each rising edge of the system clock signal CLK. Specifically, based on the level of the clock activation signal CKE at a rising edge of the system clock signal CLK, it is determined whether or not a pulse is generated as the internal clock signal clk_in in synchronization with a pulse of the system clock CLK in the subsequent clock cycle. For example, when the level of the clock activation signal CKE at a rising edge of the system clock signal CLK is a high level "H", a pulse is generated as an internal clock signal clk_in in synchronization with a pulse of the system clock CLK in the subsequent clock cycle. When the level of the clock activation signal CKE at a rising edge of the system clock signal CLK is a low level "L", a pulse of the internal clock signal clk_in is not generated in the subsequent clock cycle.

The generated internal clock signal clk_in is used as a synchronization signal in each of latch circuits 56 (FIG. 12) for latching an input address data signal and a control signal, etc., which are provided from outside. Each latch circuit 56 outputs the input address data signal and the control signal, etc., to the principal part of the semiconductor storage device in synchronization with the internal clock signal clk_in.

However, in a conventional internal clock activation signal generation circuit 52, since the level of the clock activation signal CKE must be referred to at each rising edge of the system clock signal CLK, a large amount of electric current is consumed by a clock buffer of the internal clock activation signal generation circuit 52 which receives the system clock signal CLK. That is, switching of logic gates such as the first D-FF circuit 50, the inverter INV50, the NAND gate NAND54, etc., to which the system clock signal CLK is directly input, generates a discharge current due to a gate capacitance or a parasitic capacitance in a logic gate, etc., to which an output of a previous logic gate is supplied, in addition to the generation of a through-current. Thus, the amount of current consumed when the clock activation signal CKE is at a low level "L" and the semiconductor storage device is on standby cannot be reduced.

Especially when the frequency of the system clock signal CLK is increased, the current consumption is from about several hundreds of microamperes to about 1 mA. In a commonly-employed SDRAM, such an increase in current consumption is a significant problem.

Japanese Laid-Open Publication No. 7-177015 discloses a method for reducing the current consumption in the standby state of SDRAM. According to this method, when a first stage circuit, which receives external input signals used in the SDRAM except for the system clock signal CLK and the clock activation signal CKE, is on standby, power supply to the first stage circuit is stopped, whereby the current consumption is reduced.

However, such a method requires a level detection circuit for detecting the level of the clock activation signal CKE in order to detect the standby state, and it is required to incessantly supply the system clock signal CLK to the level detection circuit. Thus, as the frequency of the system clock signal CLK increases, the amount of current consumed by the level detection circuit increases.

Furthermore, Japanese Laid-Open Publication No. 11-16349 discloses a method for reducing the amount of current consumed when an internal operation of a storage device is on standby. According to this method, in the case where the clock activation signal CKE turns to a high level "H" and the internal operation is on standby, the internal clock signal is eliminated, whereby the current consumption is reduced.

However, according to such a method, in the case where the clock activation signal CKE is at a low level "L" and the internal operation is on standby, or in the case where a clock signal is adjusted to the operation frequency of an external system with which signals are exchanged, the current consumption cannot be reduced when the internal operation is in a clock suspend mode (which is an operation mode for memory access) by partially masking the clock signal so as to decrease the operation frequency.

Since a clock synchronous semiconductor storage device receives input signals at latch circuits in synchronization with rising edges of a system clock signal, the latch circuits each need to have received the system clock signal before or at the time of data input. Therefore, a conventional synchronous semiconductor storage device receives input data while an internal clock signal clk_in which has been generated by the internal clock signal generation circuit 53 (FIG. 10) is being incessantly input to the latch circuits; or receives input data such that, as described in Japanese Laid-Open Publication No. 11-16349, an internal clock signal clk_in is generated only when the data is input to the synchronous semiconductor storage device. However, in such a structure, the system clock signal which is input to a clock buffer of a level detection circuit for detecting the level of the clock activation signal CKE cannot be removed.

Thus, in the conventional synchronous semiconductor storage device, there are significant drawbacks in that a current of from about several hundreds of microamperes to about 1 mA is consumed even in a clock buffer portion of the level detection circuit for detecting the level of the clock activation signal CKE due to the variation of the system clock signal, and that the current consumption increases due to the increase in frequency of the system clock signal.

SUMMARY OF THE INVENTION

According to one aspect of the present invention, a synchronous semiconductor storage device includes: an internal clock activation signal generation circuit for generating an internal clock activation signal cke_c and a latch signal cke1 based on a system clock signal CLK and a clock activation signal CKE each having a series of pulses: a CKE latch clock control signal generation circuit for generating, based on the internal clock activation signal cke_c, the latch signal cke1, the system clock signal CLK, and the clock activation signal CKE, a CKE latch clock control signal cke_x which is controls activation/inactivation of a CKE latch clock signal; and an internal clock signal generation circuit for generating an internal clock signal clk_in based on the internal clock activation signal cke_c and the system clock signal CLK, wherein stored data corresponding to a plurality of external signals including a control signal and an address signal are transmitted in synchronization with the internal clock signal clk_in.

In one embodiment of the present invention, the internal clock activation signal generation circuit includes: a clock buffer for controlling an input of the system clock signal CLK based on the CKE latch clock control signal cke_x generated by the CKE latch clock control signal generation circuit; an inverter which receives an output from the clock buffer; and a CKE level hold circuit including serially connected three latch circuits, which generates the internal clock activation signal cke_c and the latch signal cke1 from the clock activation signal CKE or from a signal derived from the clock activation signal CKE based on an output of the inverter and the output of the clock buffer.

In another embodiment of the present invention, the internal clock signal generation circuit includes a clock buffer for controlling an input of the system clock signal CLK based on the internal clock activation signal cke_c generated by the internal clock activation signal generation circuit.

In still another embodiment of the present invention, the CKE latch clock control signal generation circuit includes: a standby state detection circuit for generating a control signal which inactivates the CKE latch clock control signal cke_x based on the internal clock activation signal cke_c and the latch signal cke1 generated by the internal clock activation signal generation circuit; a non-standby state detection circuit for generating a control signal which activates the CKE latch clock control signal cke_x, based on the system clock signal CLK and the clock activation signal CKE; a latch circuit which receives the control signal from the standby state detection circuit and the control signal from the non-standby state detection circuit.

In still another embodiment of the present invention, the level of the clock activation signal CKE is latched at a rising edge of the system clock signal CLK, by first and second latch circuits among the three latch circuits included in the CKE level hold circuit, based on the internal clock activation signal cke_c; and the latched level of the clock activation signal CKE is identical with a level of a signal which is held at a falling edge of the system clock signal CLK and output by a third latch circuit of the CKE level hold circuit.

In still another embodiment of the present invention, the CKE latch clock control signal cke_x generated by the CKE latch clock control signal generation circuit is activated by the control signal output from the non-standby state detection circuit and inactivated by the control signal output from the standby state detection circuit; and alternation between an active state and an inactive state is made in synchronization with a falling edge of the system clock signal CLK.

In still another embodiment of the present invention, the synchronous semiconductor storage device further including: a memory cell array including a plurality of memory cells arranged in a matrix; and a row select circuit for selecting, in response to an input address, a row in the memory cell array which corresponds to the input address, wherein memory cells in the selected row are sequentially accessed in a synchronous burst mode in synchronization with the internal clock signal clk_in.

Thus, the invention described herein makes possible the advantages of (1) providing a synchronous semiconductor storage device which can reduce the current consumption when it is on standby by removing a system clock signal which is to be input to a circuit for detecting the level of a clock activation signal CKE, and (2) providing a synchronous semiconductor storage device which can reduce the current consumption, even when in operation, as long as it operates in a clock suspension mode.

These and other advantages of the present invention will become apparent to those skilled in the art upon reading and understanding the following detailed description with reference to the accompanying figures.

DESCRIPTION OF THE PREFERRED EMBODIMENTS

Hereinafter, an embodiment of the present invention will be described with reference to the drawings.

Figure 1:
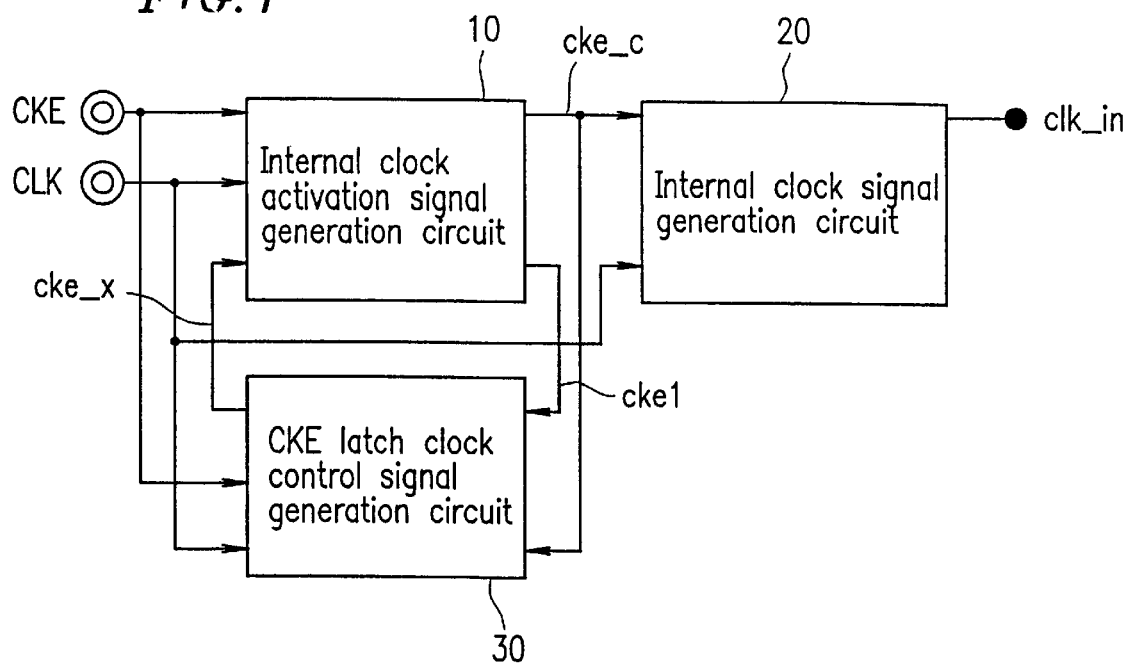
FIG. 1 shows an exemplary configuration of an input section which generate an internal clock signal in a synchronous semiconductor storage device of the present invention.

FIG. 1 is a block diagram showing an exemplary input section of an SDRAM according to the present invention. This SDRAM is a synchronous semiconductor storage device which operates in a synchronous burst mode. According to the synchronous burst mode, the SDRAM selects, based on an externally provided address signal, a memory cell in a memory cell array which corresponds to the address signal in synchronization with an internal clock signal clk_in which is generated in the SDRAM. Then, the SDRAM transmits data in the selected memory cell in synchronization with an internal clock signal clk_in.

The SDRAM includes an internal clock activation signal generation circuit 10, an internal clock signal generation circuit 20, and a CKE latch clock control signal generation circuit 30. The internal clock activation signal generation circuit 10 receives a system clock signal CLK and a clock activation signal CKE, and generates an internal clock activation signal cke_c and a latch signal cke1 based on the system clock signal CLK and the clock activation signal CKE.

The internal clock activation signal cke_c generated by the internal clock activation signal generation circuit 10 is supplied to the internal clock signal generation circuit 20 and the CKE (clock activation signal) latch clock control signal generation circuit 30. The latch signal cke1 is supplied to the CKE latch clock control signal generation circuit 30.

The internal clock signal generation circuit 20 generates an internal clock signal clk_in based on the internal clock activation signal cke_c generated by the internal clock activation signal generation circuit 10 and the system clock signal CLK, and outputs the internal clock signal clk_in to the principal part of the SDRAM. An externally provided address signal selects a corresponding memory cell in a memory cell array in synchronization with an internal clock signal clk_in, and data in the selected memory cell is transmitted in synchronization with an internal clock signal clk_in.

The CKE latch clock control signal generation circuit 30 receives the system clock signal CLK and the clock activation signal CKE in addition to the internal clock activation signal cke_c and the latch signal cke1 generated by the internal clock activation signal generation circuit 10. Based on these signals, the CKE latch clock control signal generation circuit 30 generates a CKE latch clock control signal cke_x, and outputs it to the internal clock activation signal generation circuit 10.

Figure 2:
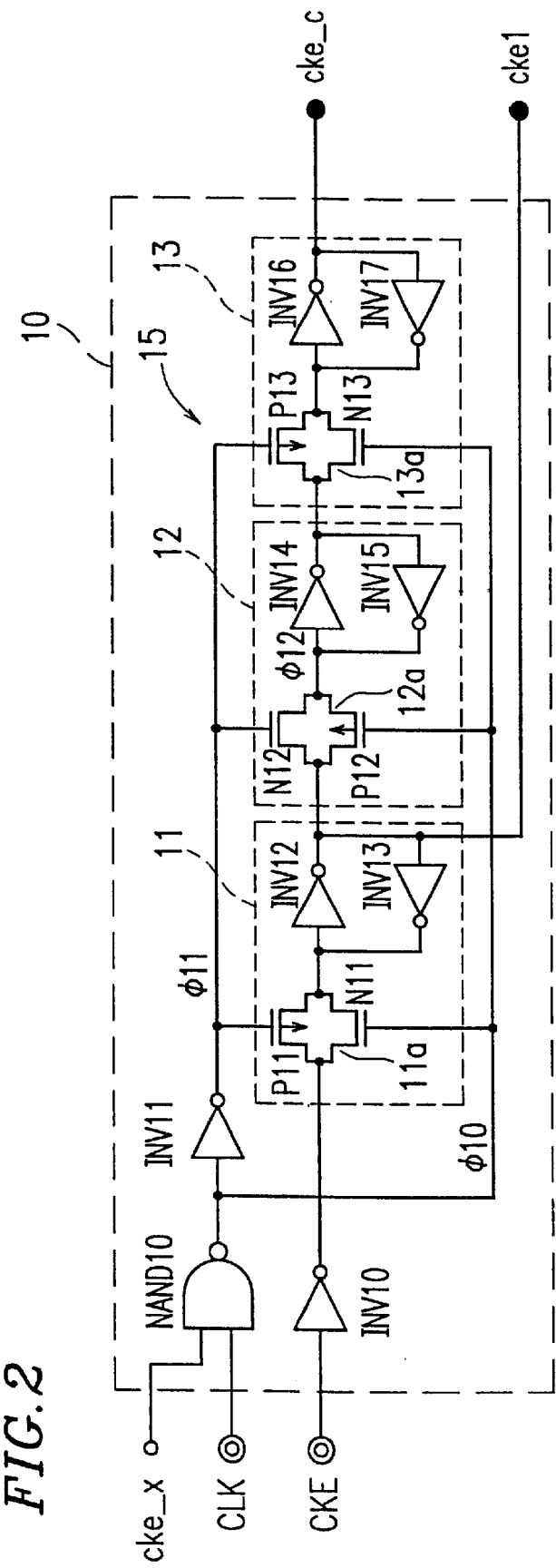
FIG. 2 shows a structure of an internal clock activation signal generation circuit.

FIG. 2 shows a structure of the internal clock activation signal generation circuit 10, which includes an NAND gate NAND10, an inverter INV10, an inverter INV11, and a CKE level hold circuit 15. The CKE level hold circuit 15 includes a first latch circuit 11, a second latch circuit 12, and a third latch circuit 13. The first latch circuit 11 includes a transmission gate 11a, an inverter INV12, and an inverter INV13. The transmission gate 11a includes a PMOS transistor P11 and an NMOS transistor N11. The second latch circuit 12 includes a transmission gate 12a, an inverter INV14, and an inverter INV15. The transmission gate 12a includes a PMOS transistor P12 and an NMOS transistor N12. The third latch circuit 13 includes a transmission gate 13a, an inverter INV16, and an inverter INV17. The transmission gate 13a includes a PMOS transistor P13 and an NMOS transistor N13.

The inverter INV10 receives a clock activation signal CKE. The NAND gate NAND10, which is a clock buffer, receives the CKE latch clock control signal cke_x for latching the clock activation signal CKE, and the system clock signal CLK.

The NAND gate NAND10 outputs a CKE latch clock signal φ10 directly to each of the latch circuits 11–13 and a CKE latch clock signal φ11 to each of the latch circuits 11–13 through the inverter INV11. Furthermore, a signal output from the inverter INV10 is supplied to the first latch circuit 11.

The transmission gate 11a of the first latch circuit 11 receives an output of the inverter INV10. A gate of the PMOS transistor P11, which is a part of the transmission gate 11a, receives the CKE latch clock signal φ11 from the inverter INV11. A gate of the NMOS transistor N11, which is the other part of the transmission gate 11a, receives the CKE latch clock signal φ10 from the NAND gate NAND10. When the gate of the PMOS transistor P11 is at a low level "L" and the gate of the NMOS transistor N11 is at a high level "H", the transmission gate 11a outputs a signal.

The signal output from the transmission gate 11a is supplied to the inverter INV12. An output of the inverter INV12 is supplied to the second latch circuit 12 and is also fed back to the inverter INV12 through the inverter INV13. Furthermore, the output of the inverter INV12 is output as a latch signal cke1 to outside of the internal clock activation signal generation circuit 10.

In the second latch circuit 12, the transmission gate 12a formed by the PMOS transistor P12 and the NMOS transistor N12 receives the output of the inverter INV12, i.e., the output of the first latch circuit 11. In the transmission gate 12a, a gate of the NMOS transistor N12 receives the output of the inverter INV11, i.e., the CKE latch clock signal φ11, and a gate of the PMOS transistor P12 receives the CKE latch clock signal φ10 from the NAND gate NAND10.

An output of the transmission gate 12a is supplied to the third latch circuit 13 through the inverter INV14, and is also fed back to the inverter INV14 through the inverter INV15.

In the third latch circuit 13, the transmission gate 13 a formed by the PMOS transistor P13 and the NMOS transistor N13 receives the output of the inverter INV14, i.e., the output of the second latch circuit 12. In the transmission gate 13a, a gate of the PMOS transistor P13 receives the CKE latch clock signal φ11 from the inverter INV11, and a gate of the NMOS transistor N13 receives the CKE latch clock signal φ10 from the NAND gate NAND10.

An output of the transmission gate 13a is output as an internal clock activation signal cke_c from the internal clock activation signal generation circuit 10 through the inverter INV16, and is also fed back to the inverter INV16 through the inverter INV17.

Figure 3:
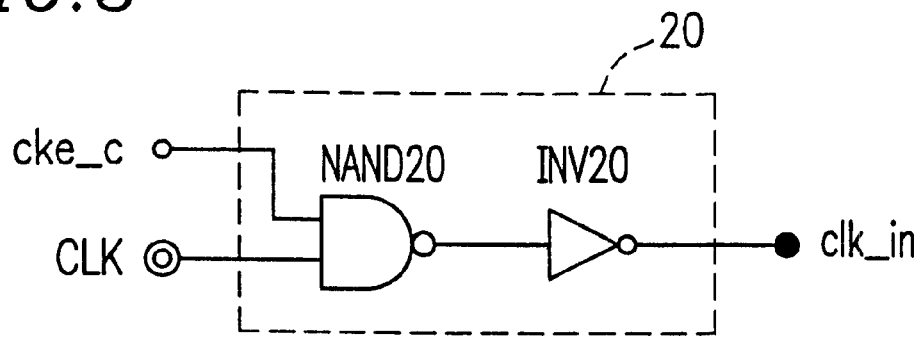
FIG. 3 shows a structure of an internal clock signal generation circuit.

The internal clock activation signal cke_c from the internal clock activation signal generation circuit 10 is supplied to an internal clock generation circuit 20 shown in FIG. 3. The internal clock generation circuit 20 includes an NAND gate NAND20 which receives the internal clock activation signal cke_c and the system clock circuit CLK, and an inverter INV20 which receives an output of the NAND gate NAND20. The inverter INV20 outputs an internal clock signal clk_in to outside of the internal clock generation circuit 20.

Figure 4:
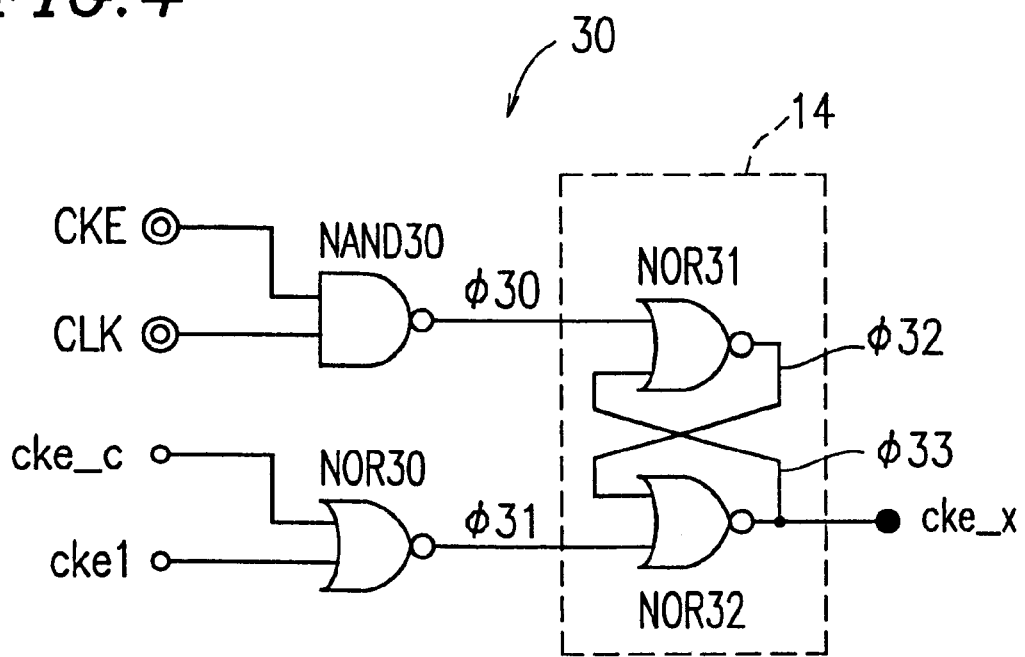
FIG. 4 shows a structure of a CKE latch clock control signal generation circuit.

As well, the internal clock activation signal cke_c and the latch signal cke1 from the internal clock activation signal generation circuit 10 are also input to the CKE latch clock control signal generation circuit 30 as shown in FIG. 4. The CKE latch clock control signal generation circuit 30 includes an NAND gate NAND30, an NOR gate NOR30, and a latch circuit 14. The latch circuit 14 includes an NOR gate NOR31 and an NOR gate NOR32.

The NAND gate NAND30, which is a non-standby state detection circuit, receives the clock activation signal CKE and the system clock signal CLK. The NOR gate NOR30, which is also a standby state detection circuit, receives the internal clock activation signal cke_c and the latch signal cke1. The latch circuit 14 receives a CKE latch clock set signal φ30 from the NAND gate NAND30 and a CKE latch clock reset signal φ31 from the NOR gate NOR30.

The NOR gate NOR31 of the latch circuit 14 receives the CKE latch clock set signal φ30 from the NAND gate NAND30 and a latch output signal φ33 from the NOR gate NOR32. The NOR gate NOR32 receives the CKE latch clock reset signal φ31 from the NOR gate NOR30 and a latch output signal φ32 from the NOR gate NOR31. The NOR gate NOR32 outputs a CKE latch clock control signal cke_x.

Figure 5:
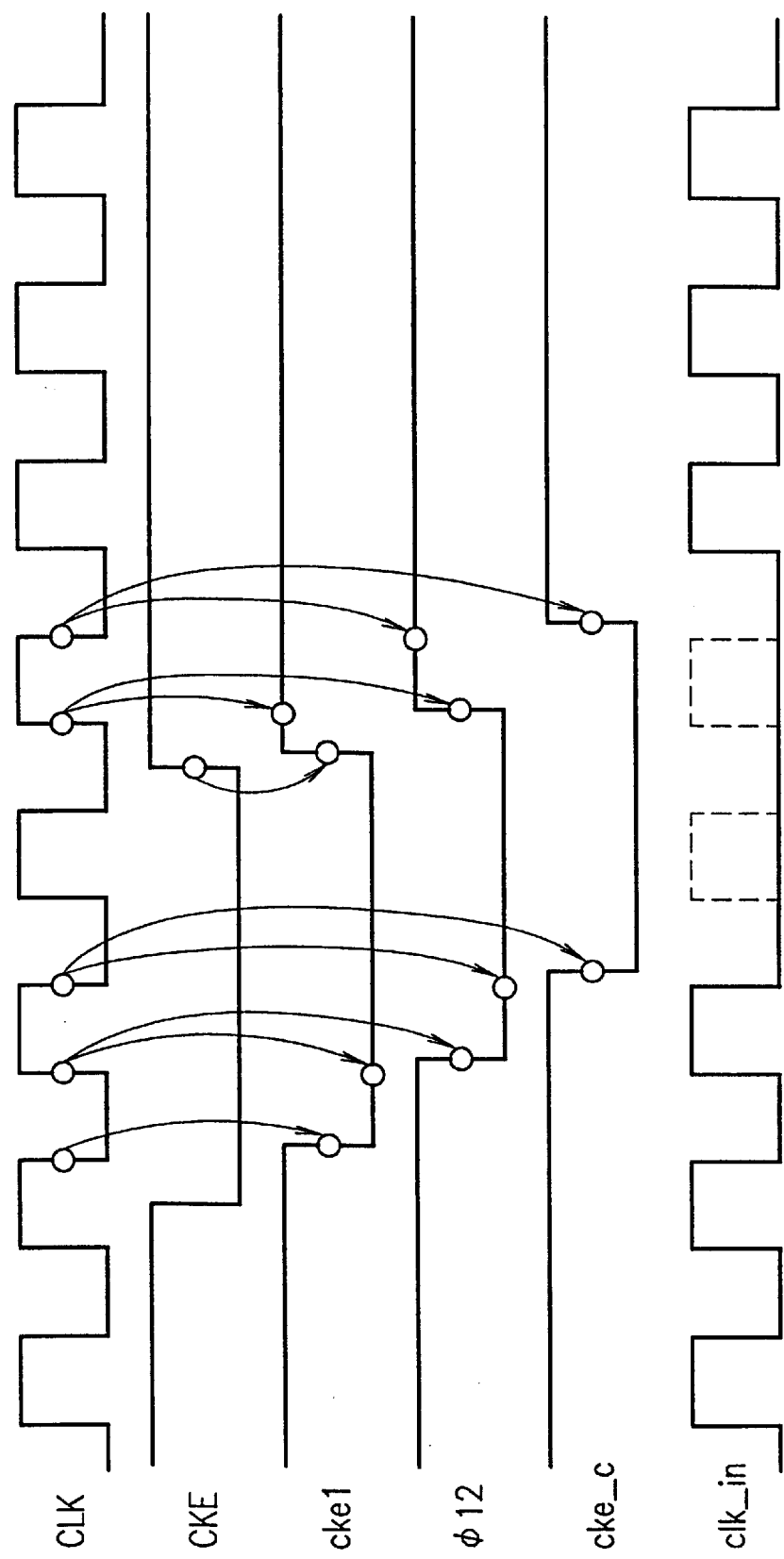
FIG. 5 is a timing chart which illustrates an operation of the internal clock activation signal generation circuit.

An operation of the internal clock activation signal generation circuit 10 shown in FIG. 2 is now described with reference to a timing chart shown in FIG. 5. In the case where the clock activation signal CKE is input to the inverter INV10 while a system clock signal CLK which pulses in a certain cycle is being input to the NAND gate NAND10, when the clock activation signal CKE is at a low level "L" at a falling edge of the system clock signal CLK, a latch signal cke1 is latched by the first latch circuit 11 at a low level "L". In general, in the case where the clock activation signal CKE is at a low level at a falling edge of the system clock signal CLK, the clock activation signal CKE is latched at a low level; and alternatively, in the case where the clock activation signal CKE is at a high level at a rising edge of the system clock signal CLK, the clock activation signal CKE is latched at a high level. That is, based on the latched state of the clock activation signal CKE, the latch signal cke1 is generated. The latched signal cke1 is sent out of the internal clock activation signal generation circuit 10, and is also supplied to the second latch circuit 12.

The second latch circuit 12 latches the latch signal cke1 which is the output signal from the first latch circuit 11 and, at the subsequent falling edge of the system clock signal CLK, outputs the latched signal to the third latch circuit 13.

The third latch circuit 13 latches the latched signal from the second latch circuit 12 and, at the subsequent falling edge of the system clock signal CLK, outputs the latched signal as an internal clock activation signal cke_c for activating an internal clock signal clk_in.

Upon receiving the thus-generated internal clock activation signal cke_c, the internal clock generation circuit 20 shown in FIG. 3 outputs the signal whose pulses are masked as long as the internal clock activation signal cke_c is at a low level "L", as an internal clock signal clk_in. The internal clock signal clk_in is at a low level "L" while the internal clock activation signal cke_c is at a low level "L".

An operation of the CKE latch clock control signal generation circuit 30 shown in FIG. 4 is now described with reference to a timing chart shown in FIG. 6. When the clock activation signal CKE is at a high level "H", the CKE latch clock set signal φ30 falls to a low level "L" in synchronization with a rising edge of the system clock signal CLK, and the NAND gate NAND30 outputs this CKE latch clock set signal φ30 at a low level "L". In such a case, the CKE latch clock control signal cke_x, which is the output of the latch circuit 14, is set to a high level "H".

As a result, when the clock activation signal CKE is at a low level "L", in the internal clock activation signal generation circuit 10 shown in FIG. 2, the CKE latch clock signal φ11 is input to each of the first, second, and third latch circuits 11, 12, and 13. Accordingly, both the internal clock activation signal cke_c and the latch signal cke1 from the internal clock activation signal generation circuit 10 are at a low level "L". In such a case, in the CKE latch clock control signal generation circuit 30 shown in FIG. 4, the CKE latch clock reset signal φ31, which is the output of the NOR gate NOR30, rises to a high level "H", and accordingly, the CKE latch clock control signal cke_x is set to a low level "L" by the latch circuit 14.

Figure 6:
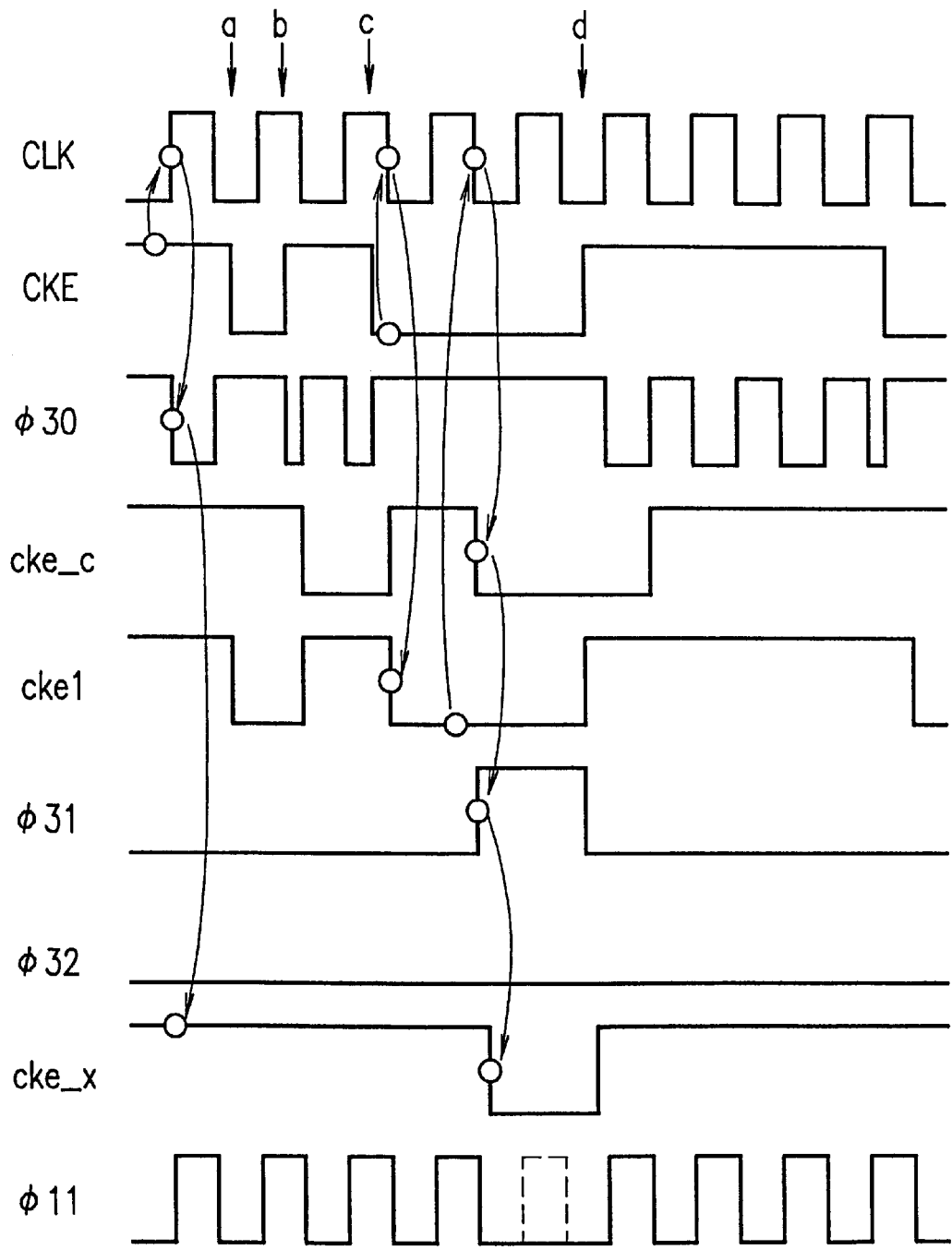
FIG. 6 is a timing chart which illustrates an operation of the CKE latch clock control signal generation circuit.

It should be noted that in the timing chart of FIG. 6, the CKE latch clock control signal cke_x varies only when the system clock signal CLK is at a low level "L". Therefore, the NAND gate NAND10, which is a clock buffer, can control the state (active or inactive) of the internal clock signal clk_in using a pulse of the system clock signal CLK as a minimum unit for control. As a result, the synchronous semiconductor storage device can be controlled precisely by using a pulse of the system clock signal CLK as a minimum unit for control.

Furthermore, as shown in table 1, whether the timing at which the clock activation signal CKE varies is within a high level period ("H" period) of the system clock signal CLK (points "b" and "c" in FIG. 6) or within a low level period ("L" period) of the system clock signal CLK (points "a" and "d" in FIG. 6), the internal clock signal clk_in can be controlled precisely on the basis of a pulse of the system clock signal CLK as a minimum unit for control. As a result, the generation of the CKE latch clock control signal cke_x can be controlled.

TABLE 1

| CLK | CKE | points in Figure 6 |
|---|---|---|
| "L" period | falling edge | a |
| "H" period | rising edge | b |
| "H" period | rising edge | c |
| "L" period | falling edge | d |

When the CKE latch clock control signal cke_x is set to a low level "L", the NAND gate NAND10 (FIG. 2) turns to an inactive state, whereby the switching of the NAND gate NAND10 by the system clock signal CLK is stopped.

At the same time, the internal clock activation signal cke_c has already been at a low level "L". Thus, the NAND gate NAND20 (FIG. 3) is in an inactive state, i.e., the switching of the NAND gate NAND20 by the system clock signal CLK has been stopped.

Furthermore, in the CKE latch clock control signal generation circuit 30 shown in FIG. 4, the externally supplied clock activation signal CKE is at a low level "L". Therefore, the NAND gate NAND30 is in an inactive state, and accordingly, the switching of the NAND gate NAND30 by the system clock signal CLK has been stopped. Thus, all of clock buffer elements which directly receive the externally supplied system clock signal CLK are in an inactive state, and accordingly, the current consumption is reduced when an operation of the semiconductor storage device is on standby or is suspended.

In the internal clock generation circuit 20, the internal clock activation signal cke_c is supplied to the NAND gate NAND20, which is a clock buffer, together with the system clock signal CLK. As shown in the timing chart of FIG. 5, the internal clock signal clk_in is activated based on the polarity of the internal clock activation signal cke_c.

Figure 7:
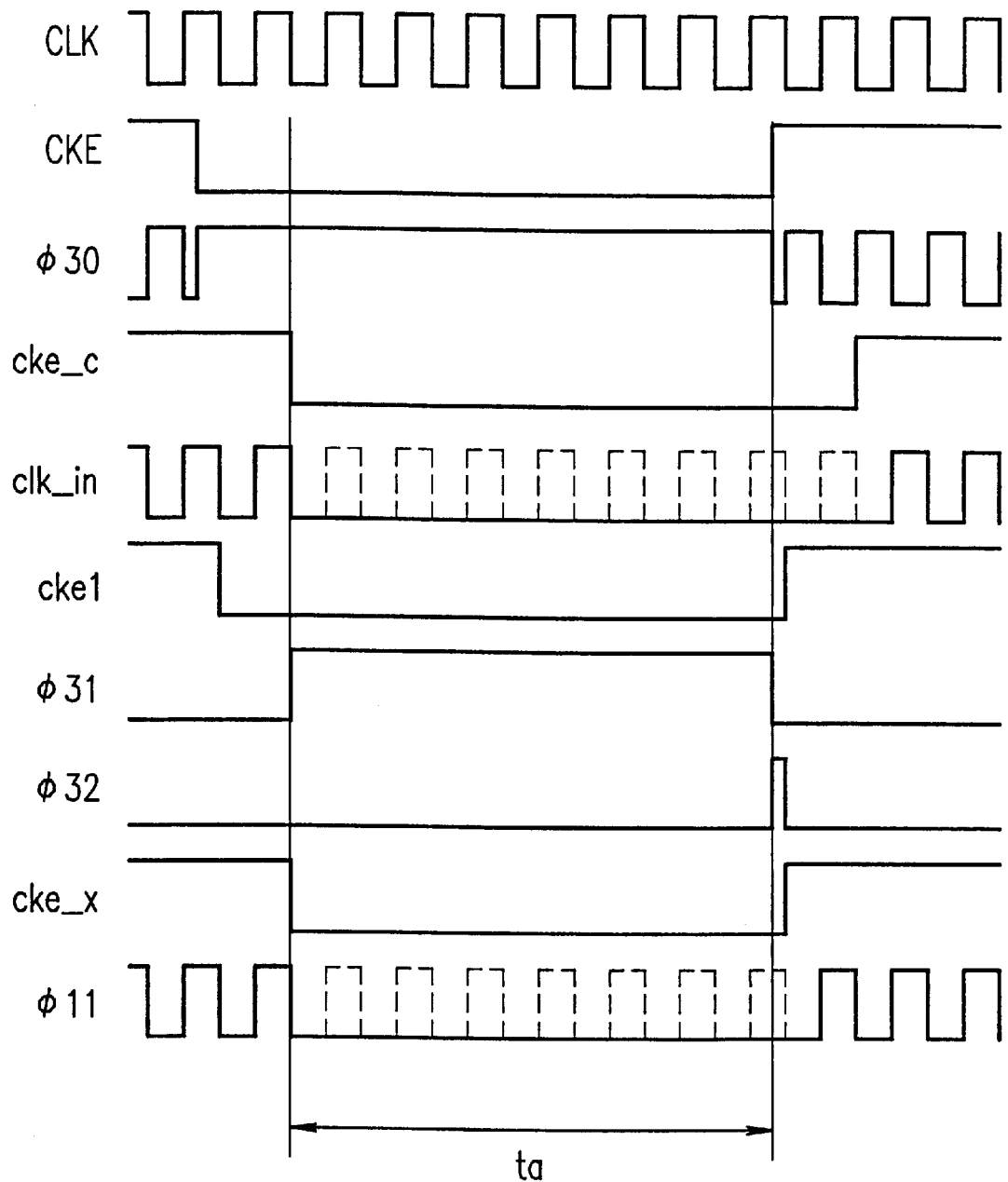
FIG. 7 is a timing chart showing waveforms of signals used in the circuits shown in FIG. 1.
Figure 8:
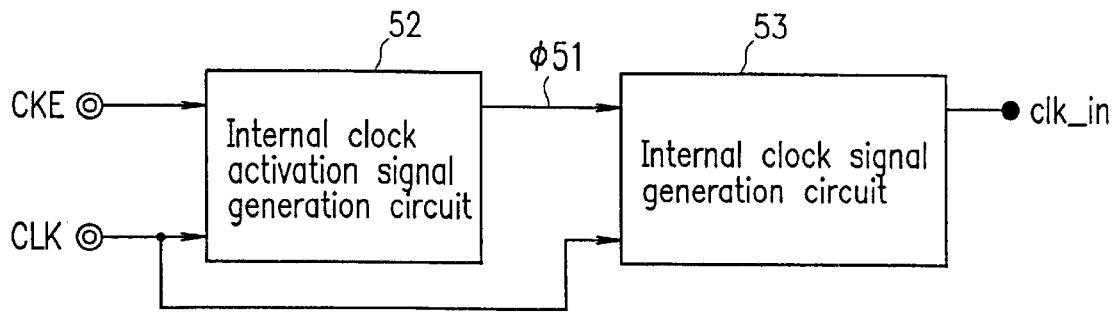
FIG. 8 shows a configuration of circuits which generate an internal clock signal in a conventional synchronous semiconductor storage device.
Figure 9:
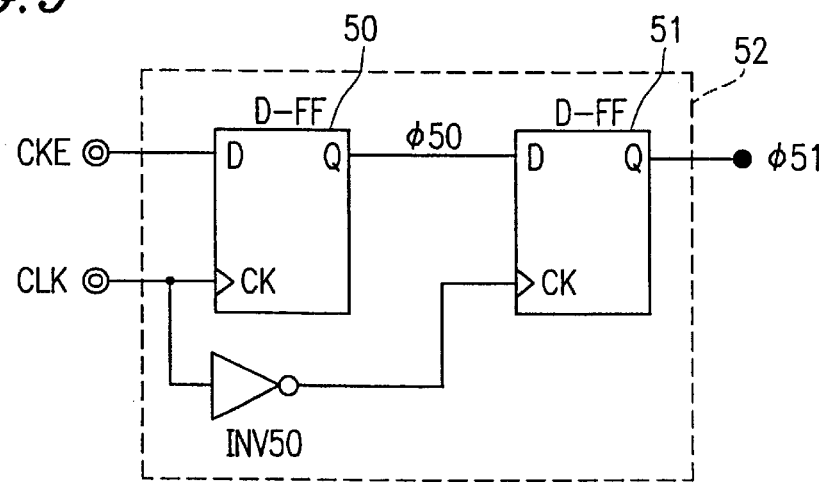
FIG. 9 shows a structure of an internal clock activation signal generation circuit which generates an internal clock activation signal in the conventional synchronous semiconductor storage device.
Figure 10:
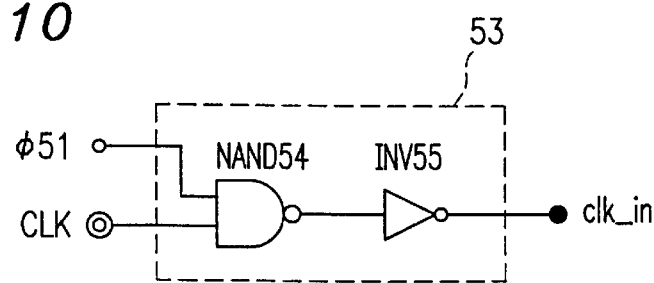
FIG. 10 shows a structure of an internal clock signal generation circuit which generates an internal clock signal in the conventional synchronous semiconductor storage device.
Figure 11:
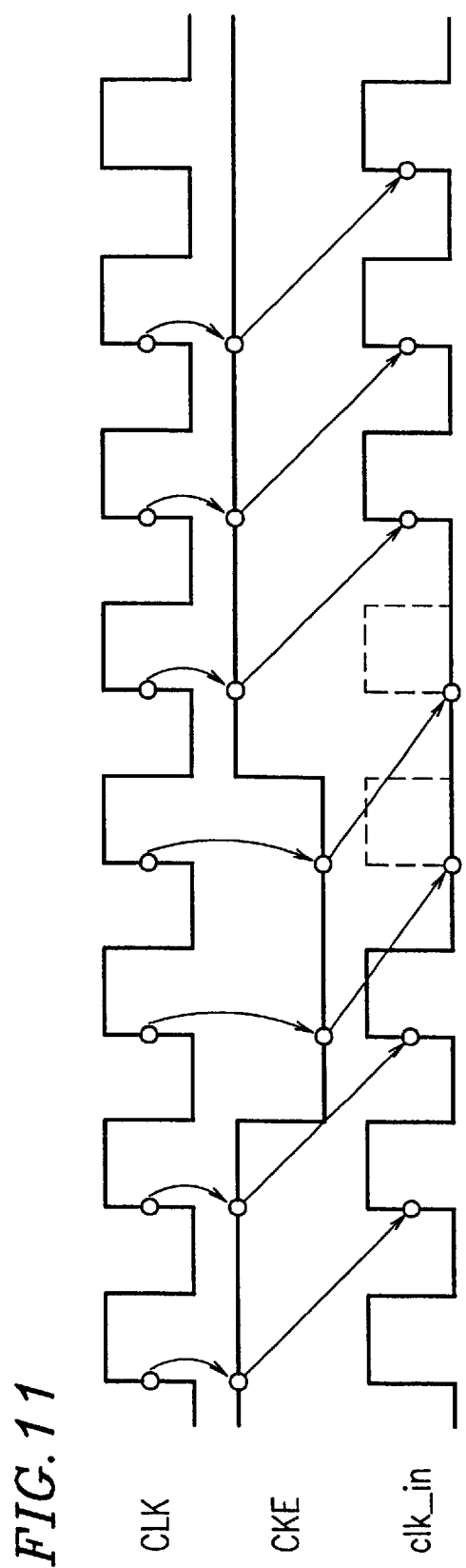
FIG. 11 is a timing chart for illustrating an operation of the conventional synchronous semiconductor storage device.
Figure 12:
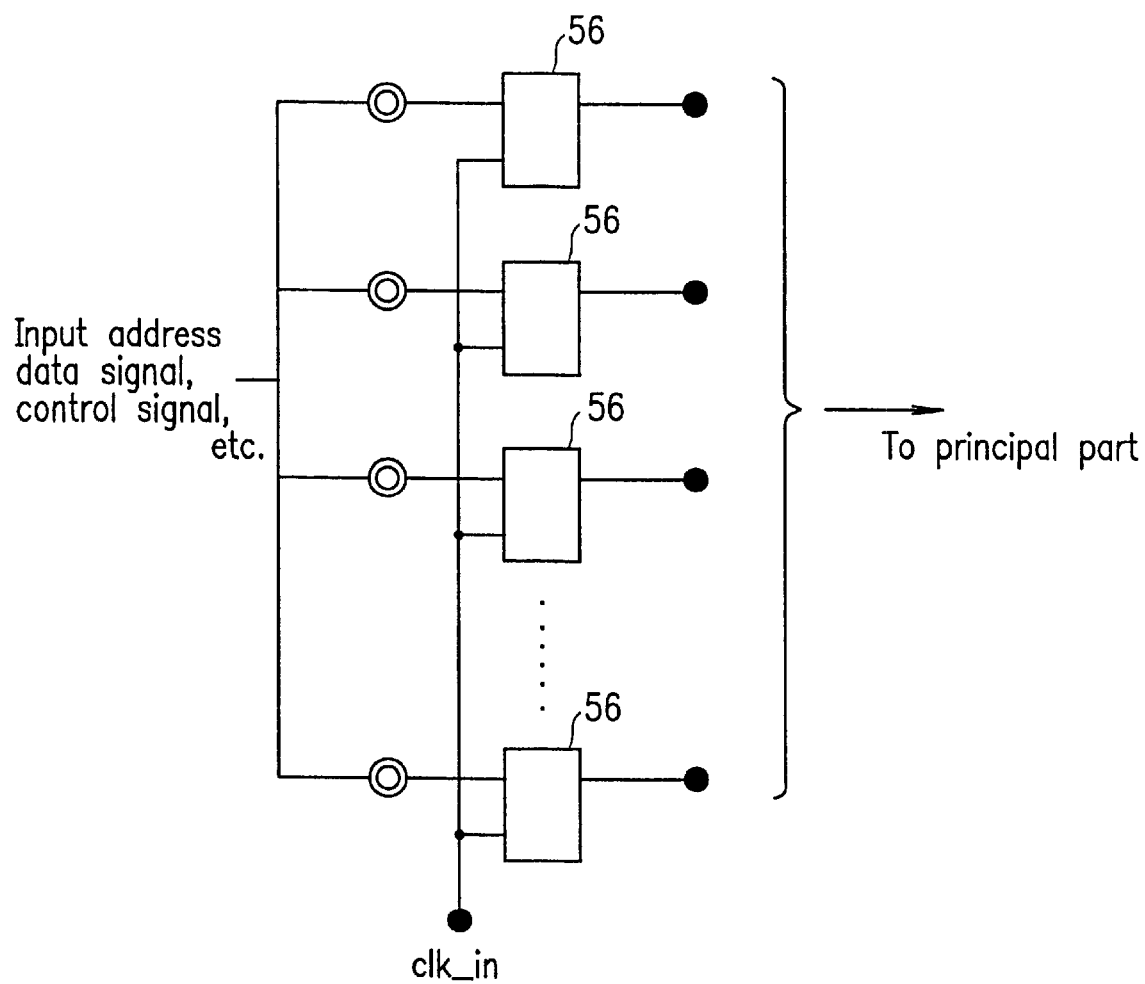
FIG. 12 schematically shows a structure of a peripheral circuit of the conventional synchronous semiconductor storage device.

FIG. 7 is a timing chart showing waveforms of the signals used in the above circuits. Signals in this timing chart, except for the externally supplied system clock signal CLK, do not vary at any node in the above circuits within period ta. That is, all clock buffer circuits that operate in synchronization with the system clock signal CLK are inactive. Therefore, there is no possibility of power consumption due to AC components such as "the switching of a gate" and "charge/discharge at an output of the gate". Thus, even in the case where the frequency of the system clock signal CLK increases, the current consumption when the storage device is on standby can be reduced.

Figure 13:
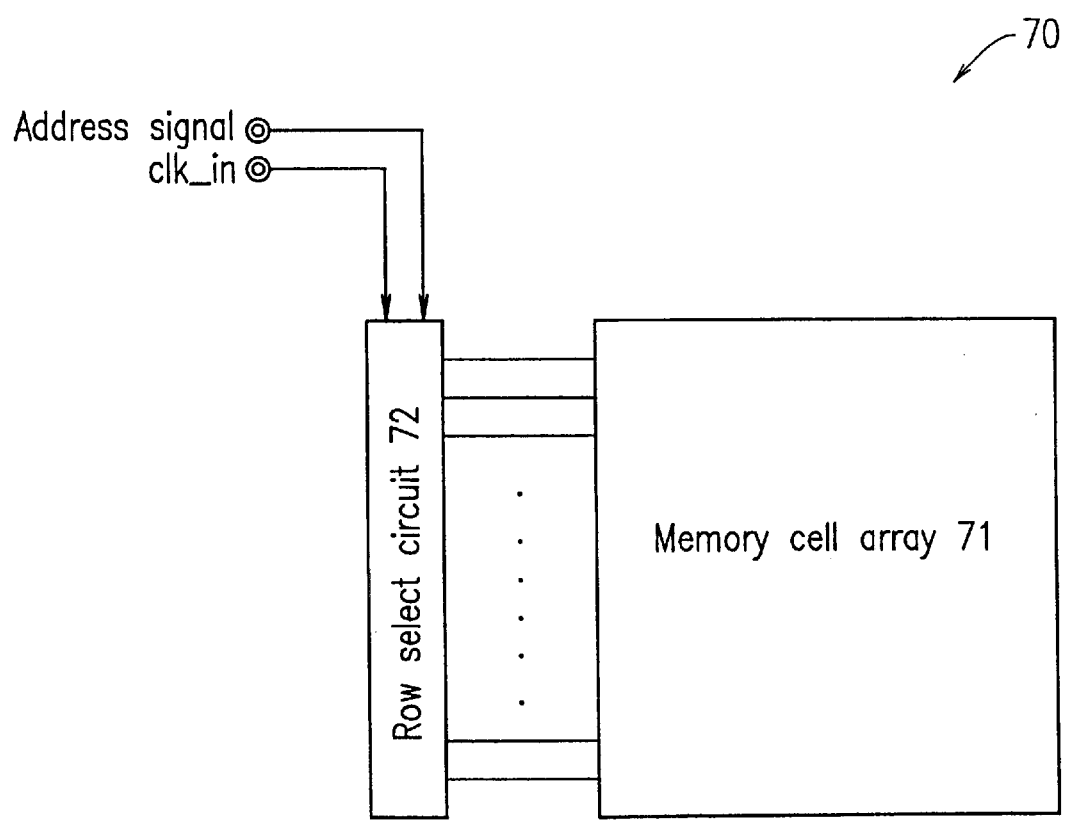
FIG. 13 schematically shows a principle part of the synchronous semiconductor storage device according to the present invention.

FIG. 13 schematically shows a principle part 70 of the synchronous semiconductor storage device according to the present invention. The principle part 70 includes a memory cell array 71 including a plurality of memory cells arranged in a matrix, and a row select circuit 72 connected to the memory cell array 71. The row select circuit 72 receives an input address signal provided from outside of the synchronous semiconductor storage device, and the internal clock signal clk_in which is generated as described above. The row select circuit 72 selects a row in the memory cell array 71 which corresponds to the input address signal, and sequentially accesses to memory cells in the selected row in a synchronous burst mode in synchronization with the internal clock signal clk_in.

As described hereinabove, in the synchronous semiconductor storage device of the present invention, when the semiconductor storage device is on standby, the system clock signal CLK, which is used for latching the level of the clock activation signal CKE and generating the internal clock activation signal cke_x, is inactivated in clock buffer circuits, whereby the power consumption due to the AC components is reduced. Therefore, even in the case where the frequency of the system clock signal CLK increases, the current consumption when the storage device is on standby can be significantly reduced.

The structure of the present invention can be achieved by providing relatively small circuits in the input circuit section which generates a system clock signal. Thus, the size of an entire semiconductor storage device does not significantly increase.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A synchronous semiconductor storage device, comprising:

an internal clock activation signal generation circuit for generating an internal clock activation signal cke_c and a latch signal cke1 based on a system clock signal CLK and a clock activation signal CKE each having a series of pulses;

a CKE latch clock control signal generation circuit for generating, based on the internal clock activation signal cke_c, the latch signal cke1, the system clock signal CLK, and the clock activation signal CKE, a CKE latch clock control signal cke_x which controls activation/inactivation of a CKE latch clock signal; and an internal clock signal generation circuit for generating an internal clock signal clk_in based on the internal clock activation signal cke_c and the system clock signal CLK, wherein stored data corresponding to a plurality of external signals including a control signal and an address signal are transmitted in synchronization with the internal clock signal clk_in.

2. A synchronous semiconductor storage device according to claim 1, wherein the internal clock activation signal generation circuit includes:

a clock buffer for controlling an input of the system clock signal CLK based on the CKE latch clock control signal cke_x generated by the CKE latch clock control signal generation circuit;

an inverter which receives an output from the clock buffer; and a CKE level hold circuit including serially connected three latch circuits, which generates the internal clock activation signal cke_c and the latch signal cke1 from the clock activation signal CKE or from a signal derived from the clock activation signal CKE based on an output of the inverter and the output of the clock buffer.

3. A synchronous semiconductor storage device according to claim 1, wherein the internal clock signal generation circuit includes a clock buffer for controlling an input of the system clock signal CLK based on the internal clock activation signal cke_c generated by the internal clock activation signal generation circuit.

4. A synchronous semiconductor storage device according to claim 1, wherein the CKE latch clock control signal generation circuit includes:

a standby state detection circuit for generating a control signal which inactivates the CKE latch clock control signal cke_x based on the internal clock activation signal cke_c and the latch signal cke1 generated by the internal clock activation signal generation circuit;

a non-standby state detection circuit for generating a control signal which activates the CKE latch clock control signal cke_x, based on the system clock signal CLK and the clock activation signal CKE:

a latch circuit which receives the control signal from the standby state detection circuit and the control signal from the non-standby state detection circuit.

5. A synchronous semiconductor storage device according to claim 2, wherein:

the level of the clock activation signal CKE is latched at a rising edge of the system clock signal CLK, by first and second latch circuits among the three latch circuits included in the CKE level hold circuit, based on the internal clock activation signal cke_c; and the latched level of the clock activation signal CKE is identical with a level of a signal which is held at a falling edge of the system clock signal CLK and output by a third latch circuit of the CKE level hold circuit.

6. A synchronous semiconductor storage device according to claim 4, wherein:

the CKE latch clock control signal cke_x generated by the CKE latch clock control signal generation circuit is activated by the control signal output from the non-standby state detection circuit and inactivated by the control signal output from the standby state detection circuit; and alternation between an active state and an inactive state is made in synchronization with a falling edge of the system clock signal CLK.

7. A synchronous semiconductor storage device according to claim 1, further comprising:

a memory cell array including a plurality of memory cells arranged in a matrix; and a row select circuit for selecting, in response to an input address, a row in the memory cell array which corresponds to the input address, wherein memory cells in the selected row are sequentially accessed in a synchronous burst mode in synchronization with the internal clock signal clk_in.

* * * * *